United States Patent
Tatsuno et al.

(10) Patent No.: US 6,782,018 B2
(45) Date of Patent: Aug. 24, 2004

(54) DIODE LASER MODULE AND APPLICATION EQUIPMENT

(75) Inventors: Kimio Tatsuno, Tokyo (JP); Masahide Tokuda, Ome (JP); Shigeharu Kimura, Tokyo (JP); Takeshi Shimano, Tokorozawa (JP); Hirohisa Sano, Niza (JP)

(73) Assignee: Hitachi, Litd., Tokyo (JP)

( * ) Notice: Subject to any disclaimer, the term of this patent is extended or adjusted under 35 U.S.C. 154(b) by 193 days.

(21) Appl. No.: 10/082,339

(22) Filed: Feb. 26, 2002

(65) Prior Publication Data

US 2003/0128726 A1 Jul. 10, 2003

(30) Foreign Application Priority Data

Jan. 10, 2002 (JP) ........................................ 2002-002932

(51) Int. Cl.[7] .............................. H01S 3/00; H01S 5/00
(52) U.S. Cl. .......................................... 372/43; 372/36
(58) Field of Search ................................ 372/36, 43–50

(56) References Cited

U.S. PATENT DOCUMENTS 5,905,750 A * 5/1999 Lebby et al. ................. 372/50

FOREIGN PATENT DOCUMENTS

| JP | 05-129730 | 11/1991 |
|----|-----------|---------|
| JP | 05-251823 | 3/1992  |

OTHER PUBLICATIONS

K. Tatsuno, K. Yoshida, T. Kato, T. Hirataka, T. Miura, K. Fukuda, T. Ishikawa, M. Shimaoka and T. Ishii, "High–Performance and Low–cost Plastic Optical Modules for Access Network System Application", IEEE, Lightwave Technology, vol. 17, No. 7, Jul. 1999, pp. 1211–1216.

* cited by examiner

Primary Examiner—Quyen Leung
(74) Attorney, Agent, or Firm—Reed Smith LLP; Stanley P. Fisher, Esq.; Juan Carlos A. Marquez, Esq.

(57) ABSTRACT

This invention is provided to reduce wavefront aberrations caused by the filling of a transparent resin intended to prevent degradation of a diode laser in a hermetically sealed package. A parallel-plane plate is arranged between a diode laser and an objective lens, and a transparent resin is filled into a space formed between the diode laser and the parallel-plane plate. With this invention, degradations of the diode lasers can be prevented and the wavefront aberrations can be reduced.

11 Claims, 10 Drawing Sheets

OPTICAL HEAD

OPTICAL HEAD

DIODE LASER MODULE AND APPLICATION EQUIPMENT

BACKGROUND OF THE INVENTION

1. Field of the Invention

The present invention relates to a laser diode module application equipment and more specifically to a technology for increasing an information recording density of an optical disc and to optical communication equipment.

2. Description of the Related Art

For higher optical disc recording speed and recording density, the output of a light source for reading and writing an optical disc needs to be increased or the wavelength of a light source shortened. This raises an optical output per unit volume or area of an interior or edge facet of a resonator in a diode laser, which in turn makes the diode laser more vulnerable to deterioration. This problem applies to conventional infrared and red diode lasers and also to blue diode lasers with a wavelength of 350 nm to 450 nm. This problem becomes more conspicuous as the wavelength decreases as in blue diode lasers. The reason for this is that as the wavelength decreases, the energy of photons increases and is likely to cause damages to crystal, making it difficult to secure a long service life. Conventional practice has involved putting a diode laser in a metal or ceramic package, covering the package with a lid and hermetically or air-tightly sealing it to isolate the laser from open air.

Attempts are being made to apply a non-hermetic package using a plastic package. A known non-hermetic sealing technique in a diode laser module for optical fiber communication protects edge facets with transparent resin such as silicone gel by potting to isolate it from external air (K. Tatsuno, et al: IEEE Journal of Lightwave Technology, Vol. 17, No. 7, pp. 1211–1216 (1999)).

SUMMARY OF THE INVENTION

The hermetic seal using metals for airtight sealing, however, raises cost and therefore techniques for lowering the production cost are being called for.

The technique for optical fiber communication which protects the end facets of an optical element by potting it with a transparent resin is not yet applied to optical writing and reading.

Application of an end face protection technique, or potting, using a transparent resin for optical fiber communication to the protection of a diode laser used in an optical disc head can prevent degradation caused by exposure to open air. Examinations by the inventors of this invention have found that a simple application of this technique gives rise to a new problem, i.e., an aberration caused by the transparent resin applied over the diode laser. The size of a light spot formed on an optical disc is a wavelength divided by a numerical aperture of an objective lens. This value is a diffraction limit. This condition can be guaranteed only when the aberration of an optical system, which focuses a beam from the diode laser on an optical disc, is removed well.

When a transparent resin is applied over a diode laser, a rough surface differing from one potting job to another is formed on the transparent resin. This causes optical path lengths in the transparent resin that rays emitted from the diode laser travel before going out into air, i.e., the lengths of rays in the resin multiplied by the refractive index, to differ from one another, resulting in an uncontrollable wavefront aberration. When the wavefront aberration is out of an allowable range, a light spot with diffraction limit can no longer be formed on the optical disc, failing to resolve fine pits, minimum units for information recording on an optical disc, in a satisfactory condition.

This is explained by referring to FIG. 1. A beam 101 from a diode laser 100 is focused by an objective lens 102 to form a spot 108 on an optical disc 103. Light reflected from the optical disc 103 passes through the objective lens 102 to reach a beam splitter 109. Light reflected by the beam splitter 109 carries an automatic focus signal, a tracking signal and an information signal and reaches a photodetector 110 where it is subjected to opto-electronic conversion, thus achieving the read/write operation on the optical disc. The diode laser 100 is contained in a package 104 in which it is embedded or potted in a transparent resin 105 for securing reliability of the diode laser. If the surface of the filled resin is uneven or rough, the wavefront 106 generated is distorted and greatly deviates from an ideal spherical wavefront such as indicated at 107. A spot 108 formed on the disc 103 is therefore spread by aberration, failing to resolve fine pits on the disc, which in turn causes errors in a retrieved signal.

The present invention therefore provides means for eliminating adverse effects of the wavefront aberration caused by the transparent resin for encapsulating the diode laser. That is, a transparent parallel-plane plate is arranged between the diode laser and the focusing lens and a space formed between the diode laser and the parallel-plane plate is filled with the transparent resin. With this arrangement, the wavefront aberration can be kept within a controllable range. The word "transparent" in this specification means that the resin has a sufficiently high transmissivity so that a quantity of light that travels from the light source via an optical disc to the photo-detector has, after being opto-electronically converted, a current value high enough to secure a desired signal-to-noise ratio. The transparent resin need only be filled into the optical path of the laser beam between the parallel-plane plate and the laser emitting portion. Other parts than the optical path do not have to be filled with the resin because they have nothing to do with the wavefront aberration. That is, the only requirement is that the filling material should cover the surface of the diode laser including the laser beam emitting portion and fill the laser beam path between the laser beam emitting portion to the parallel-plane plate. This arrangement keeps the surface of the diode laser including the laser beam emitting portion from exposure to open air, thus eliminating drawbacks such as corrosion of the laser and deterioration due to foreign matters adhering to the laser surface.

The following relationship holds between a center intensity $\eta$ of a beam spot formed on an optical disc and a standard deviation [RMS] of wavefront aberration that the beam spot forming wavefront has in a pupil of the objective lens:

$$\eta = 1 - \left(\frac{2\pi}{\lambda}\right)^2 [RMS]^2 \tag{1}$$

The center intensity $\eta$ of the beam spot formed on the optical disc, when $\eta$ that produces no aberration is taken as 1, must be 0.8 or higher in order to read pits, minimum recording information units on the optical disc, with a high signal-to-noise ratio. The standard deviation of wavefront aberration for this value is 0.07 wavelength. It is therefore desired that the overall wavefront aberration caused by the diode laser beam source, the filling material, the parallel-plane plate, the objective lens and the optical disc substrate are 0.07 wavelength or less.

When there is a space between the parallel-plane plate and the filling material, the uneven surface of the filling material causes wavefront aberrations. It is therefore important that necessary steps are taken to eliminate such a space.

The filling material, on the other hand, may easily trap moisture and thus it is also important that the space formed between the diode laser and the parallel-plane plate is made non-airtight so that it can communicate with external air to let moisture get out of the filling material.

Further, a space formed by the diode laser beam source, the laser module having a substrate with a mirror for reflecting a beam from the beam source and the parallel-plane plate may be filled with a transparent resin. In that case, when filling the transparent resin, bubbles are likely to be formed easily. To prevent this, a notch may be formed.

When a resin with a higher heat conductivity than that of air is used as the transparent resin, an improved heat dissipating effect can be produced, reducing a thermal resistance between the diode laser and the heat sink. This in turn keeps the operation temperature of the diode laser low and is expected to provide higher reliability.

It is also desired that the refraction index of the filling resin is set higher than unity. The refractive index of larger than 1 improves the refractive index of a space between the diode laser and the mirror and thus narrows the diverging angle of the beam emitted from the diode laser.

Further, when the space between the diode laser and the reflection mirror is filled with a transparent resin, the diverging angle of the diode laser beam is narrowed, which in turn allows the reflection mirror to be reduced in width and thus facilitates the reflection mirror forming process and also the process of mounting the diode laser on the substrate formed with a reflection mirror. The substrate with a reflection mirror is silicone, and by forming on the substrate an array of photo-detectors for focus error detection, tracking error detection and signal detection, the integration level of optical elements can be improved. To ensure that the beam from an optical disc reaches the photo-detectors for automatic focus detection, tracking error detection and signal detection, a diffraction grating or hologram element may be arranged between the optical disc and the substrate.

This diode laser can be used on optical disk read or write drives, or on optical communication apparatus. Optical discs include CD, CD-R, CD-RW, DVD, DVD-R, DVD-RW and ultra-high density optical discs using a blue laser. In addition to read only discs, there are rewritable optical discs using a phase change scheme and a magneto-optical effect. Thus, it is an important technical issue to secure compatibility among a variety of these optical discs. To meet these requirements, the present invention arranges a plurality of diode lasers of different wavelengths in array on the silicone substrate to allow the recording or reading of any of these optical discs with the same optical head.

When diode lasers with long wavelengths, for example 850 nm, 1300 nm and 1550 nm are used, they can be utilized as a light source module for optical fiber communication. In this application, an optical fiber instead of the optical disc is arranged where a light spot is formed. The criterion for evaluating the wavefront aberration with respect to the optical coupling efficiency to the optical fiber is given by equation (1).

After this invention was accomplished, related known examples were surveyed. As a result, JP-A-5-251823 was found. This known example describes that a resin is applied to a diode laser chip and that the resin material is filled as shown in FIG. 3. However, the package is formed with a beam emitting hole at the top and this hole is not mounted with a transparent glass. With this arrangement, the resin surface becomes uneven, resulting in aberrations.

Other objects, features and advantages of the invention will become apparent from the following description of the embodiments of the invention taken in conjunction with the accompanying drawings.

DESCRIPTION OF THE EMBODIMENTS (Embodiment 1)

Figure 1:
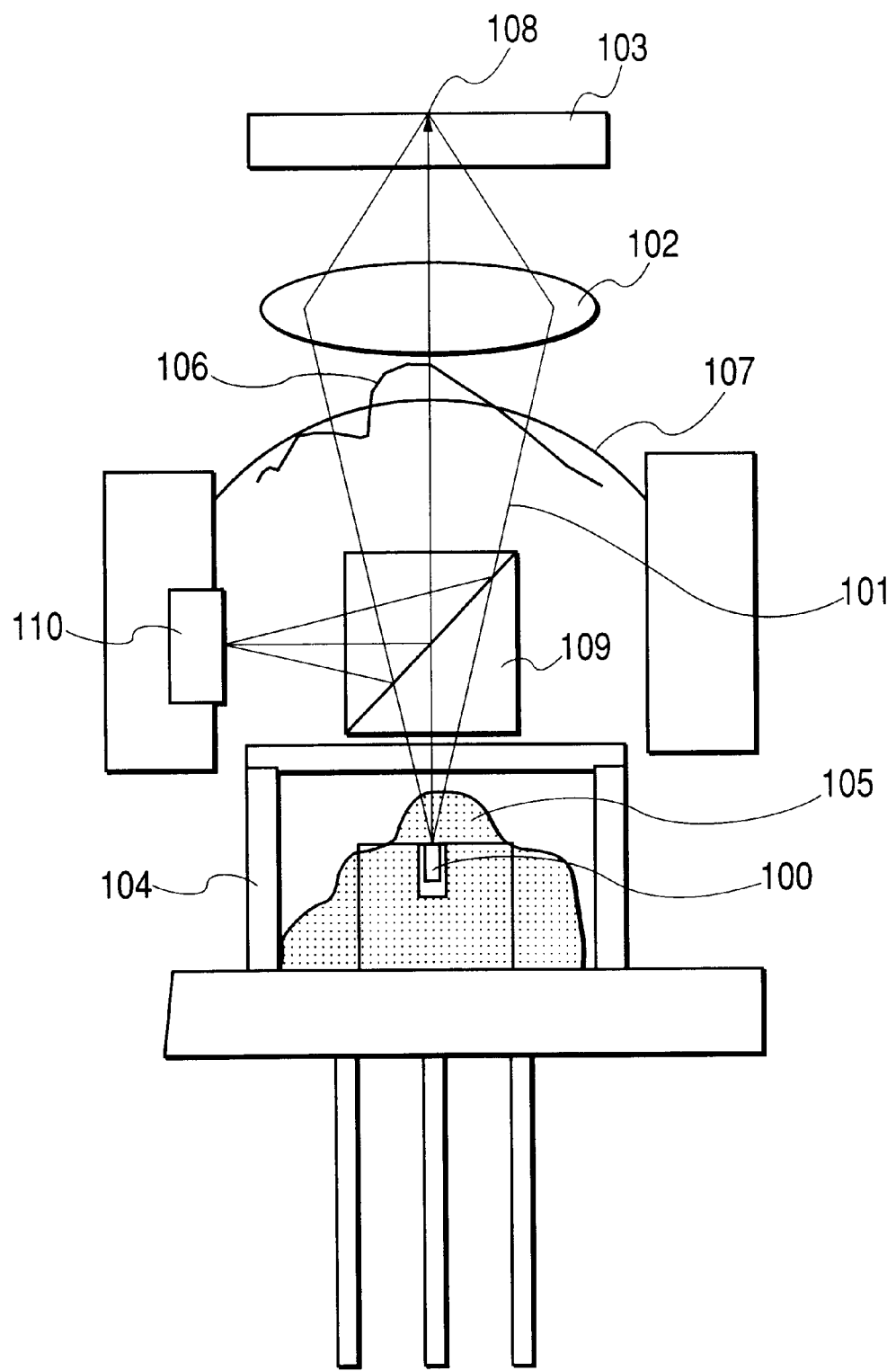
FIG. 1 is a schematic diagram showing one embodiment of this invention.
Figure 2:
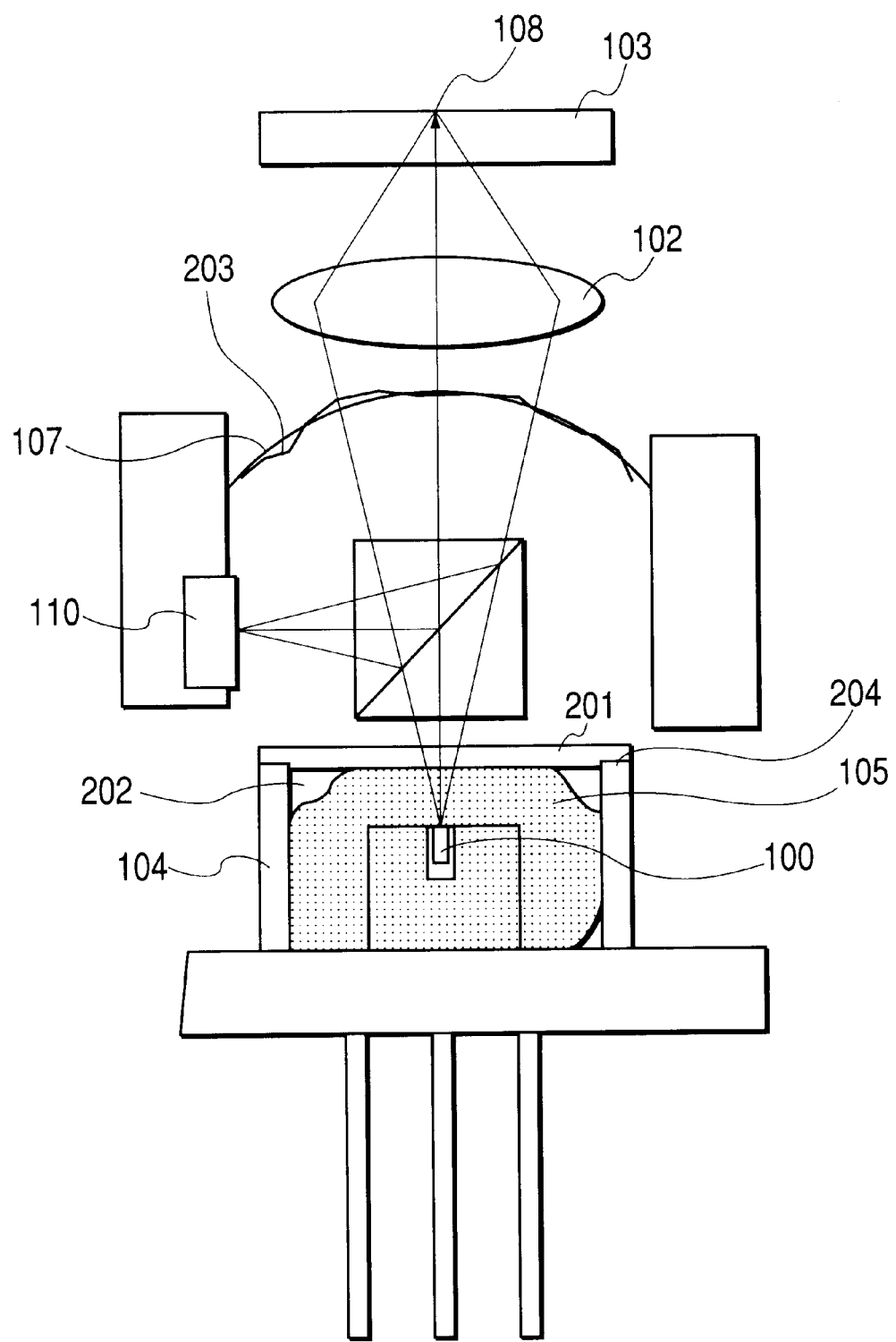
FIG. 2 is a schematic diagram showing an optical head of this invention.

FIG. 2 shows a first embodiment of the present invention. A space 202 between a diode laser 100 and a parallel-plane plate 201, which is placed between the diode laser 100 and an objective lens 102, is filled with a transparent resin 105 so that there is no air gap at least in a region in a package through which a beam emitted from the diode laser 100 passes to form a spot 108 on an optical disc. With this construction, a wavefront 203 generated is removed of distortions well to approach an ideal wavefront 107. When a distance between the parallel-plane plate 201 and the diode laser 100 is large, this can increase a spherical aberration in an on-axis arrangement and coma and astigmatism in an off-axis arrangement. In this invention, the laser configuration should preferably be designed so that an optical path difference between an actual wavefront and an ideal spherical wave, i.e., a standard deviation of wavefront aberration, is less than 0.07 times the wavelength. This is because, when the standard deviation of wavefront aberration is less than 0.07 times the wavelength, the center intensity of the spot 108 formed by the objective lens 102 will not be less than 0.8 times the intensity in case there is no aberration. Now, the relation between the standard deviation of wavefront aberration and the center intensity of the spot will be analyzed in the following discussion.

It is assumed that an incident lightwave $E(x_p, y_p)$ has a wavefront aberration $F(x_p, y_p)$ and that an amplitude distribution of the lightwave E is uniform on a pupil of objective lens 102 and zero outside the pupil.

The following equation holds:

$$E(x_f, y_f) = Const \cdot \exp\{ik\Phi(x_f, y_f)\}, k = \frac{\lambda}{2\pi} \quad (2)$$

The center intensity η of the focused spot 108 formed by the objective lens 102 is given by $$\eta = \frac{\left|\int\int E(x_f, y_f) dx_f dy_f\right|^2}{\int\int |E(x_f, y_f) dx_f dy_f|^2 dx_f dy_f} \quad (3)$$

Expanding the exponential function (2) into Taylor series results in $$\exp\{ik\Phi(x_f, y_f)\} = 1 + ik\Phi + \frac{(ik\Phi)^2}{2} + \ldots \quad (4)$$

Assuming that the aberration is relatively small, the approximation is taken to the second degree. Considering that a denominator of equation (3) is a constant, the center intensity η can be written as $$\eta = \int\int \left[1 + ik\Phi - \frac{(ik\Phi)^2}{2}\right] dx_f dy_f \quad (5)$$

$$= 1 - \left(\frac{2\pi}{\lambda}\right)^2 [av(\Phi^2) - \{av(\Phi)\}^2] \quad (6)$$

Here, "av" means an average. $av(F^2)$ represents an average of the square of wavefront aberration on the pupil of the objective lens. It is expressed as $$av(\Phi^2) = \int\int \Phi^2(x_f, y_f) dx_f dy_f \quad (7)$$

$\{av(f)\}^2$ means a square of the average of the wavefront aberration F on the pupil. It is given by $$\{av(\Phi)\}^2 = [\int\int \Phi(x_f, y_f) dx_f dy_f]^2 \quad (8)$$

Now, the relation between the center intensity η and the standard deviation [RMS] of the wavefront aberration can be obtained as follows:

$$\eta = 1 - \left(\frac{2\pi}{\lambda}\right)^2 [RMS]^2 \quad (9)$$

That is, when η=0.8, [RMS]=0.07λ. Hence, the standard deviation of the wavefront aberration caused by the silicone gel and the parallel-plane plate needs to be 0.07λ or less at most.

Silicone resin (e.g., silicone gel) is used as the transparent resin 105. Silicone gel has a property of easily coming into intimate contact with surfaces of members and thus does not leave gaps at its boundary surface with contact members, preventing dew condensations due to moisture contained in gaps. This in turn prevents chemical reactions with impurity ions and therefore deterioration due to corrosion. However, since silicone gel has a moisture absorbing capability, water may remain in silicone gel in the form of molecules. Hence, by taking advantage of the moisture permeability of silicone gel, the moisture which was trapped in the package during operations in a highly humid environment can be dissipated out of the package during operations in a low-humid environment. For this reason, the package 104 is made not perfectly hermetic but constructed so as to communicate with open air through some predetermined portions such as 204 to ensure that trapped moisture can easily get out of the package.

(Embodiment 2)

Figure 3:
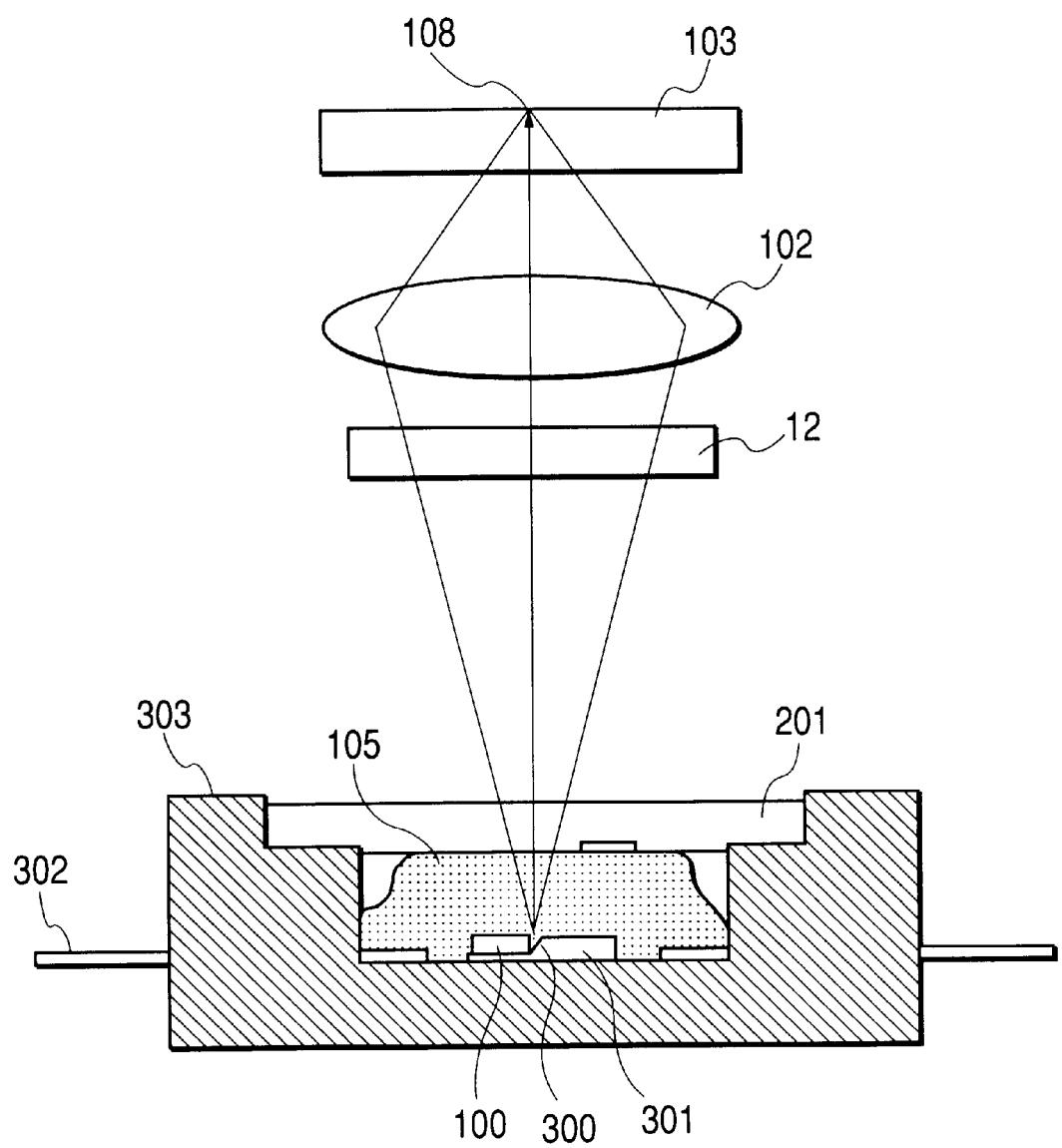
FIG. 3 is a schematic diagram showing an optical head of this invention.

FIG. 3 shows a second embodiment of this invention. A beam from the diode laser 100 is bent by a mirror 300 and focused into a spot 108 on an optical disc 103 by an objective lens 102 that collects and focuses the beam. Between the diode laser 100 and the objective lens 102 are arranged a transparent resin 105 and a parallel-plane plate 201. The diode laser 100, a substrate 301 with the mirror and the parallel-plane plate 201 are accommodated in a plastic, metal or ceramic case 303 with a lead pin 302. At least that portion in the package between the diode laser 100 and the parallel-plane plate 201 through which the beam passes is completely filled with the transparent resin. The number of objective lenses is not limited to one, and two lenses, one for collecting light and one for focusing it, may be used. Denoted 12 in the figure is a beam splitter.

Figure 4:
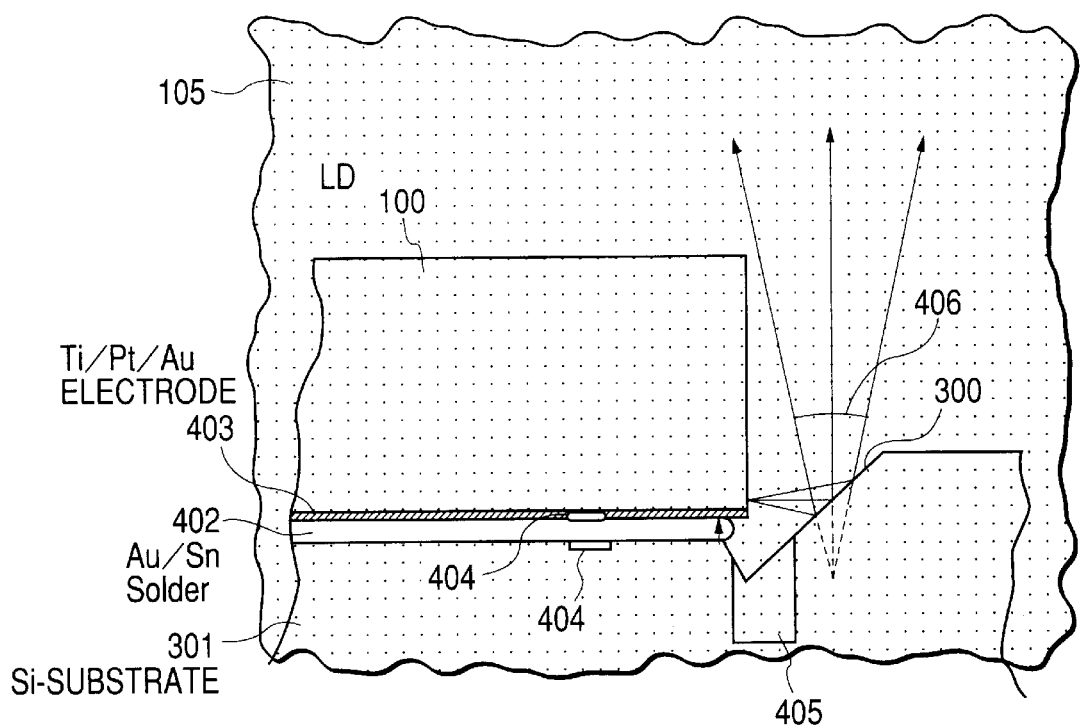
FIG. 4 illustrates a relation between a diode laser and a substrate according to the invention.

FIG. 4 is an enlarged view of FIG. 3 showing the diode laser 100 and the substrate 301 with the mirror. The diode laser 100 is secured to the substrate 301 with a solder 402 (Au/Sn solder). The diode laser 100 has an electrode pattern 403 (Ti/Pt/Au electrodes) formed at its bottom which has functions of electric conduction and heat dissipation. The surface of the substrate 301 and the contact surface of the diode laser 100 are formed with alignment marks 404 to ensure a precise positional alignment between the silicone substrate and the laser. Further, the silicone substrate 301 has a reflection mirror 300 formed therein. For a silicone substrate with an off-angle of 9.7 degrees, a 45-degree mirror can be formed by an anisotropic etch. Filling the silicone gel may result in the formation of bubbles, so a groove 405 is provided to increase the filling space, which is one of important features of this invention.

Figure 5:
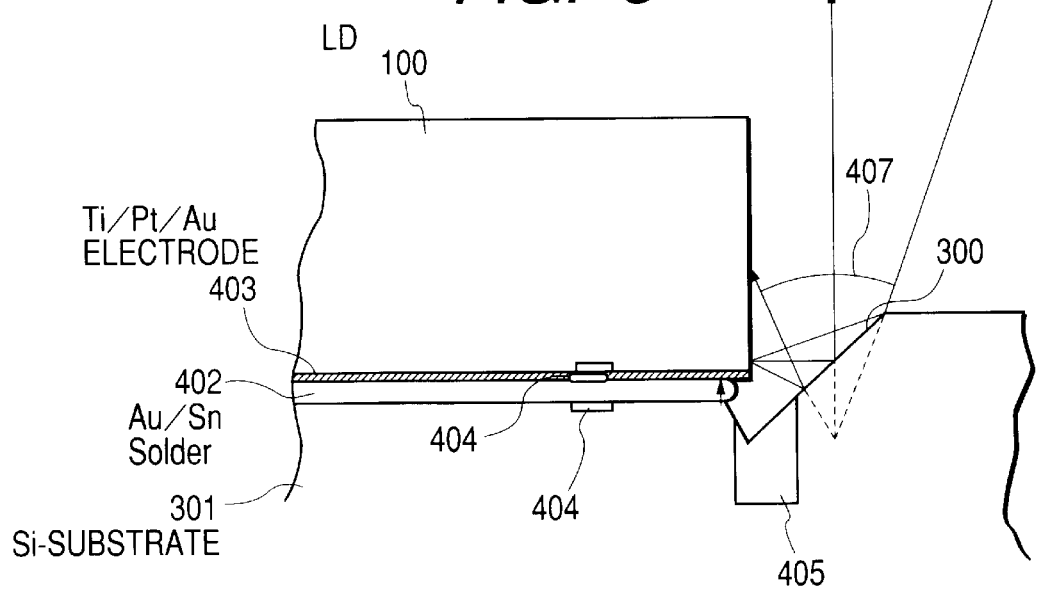
FIG. 5 illustrates a relation between a diode laser and a substrate.

With the transparent resin 105 filled as shown in FIG. 4, a diverging angle 406 of a beam emitted from the diode laser 100 can be made smaller than a diverging angle 407 in air or nitrogen gas shown in FIG. 5. The reason for this is that, when a refractive index of the transparent resin is n and an aperture radius of the diode laser 100 with a waveform length of unity is a, the diverging angle θ due to diffraction can be given by $$\theta \approx \frac{\lambda}{na} \quad (10)$$

Normally n is about 1.5. Narrowing the diverging angle of the diode laser can reduce the area of the reflection mirror 300. This allows a terrace portion of the substrate on which the diode laser 100 is mounted to be formed shallow, thereby reducing unwanted influences of the roughness of the terrace surface which would increase in proportion to the etched depth. This is another important feature of this invention.

(Embodiment 3)

Figure 6:
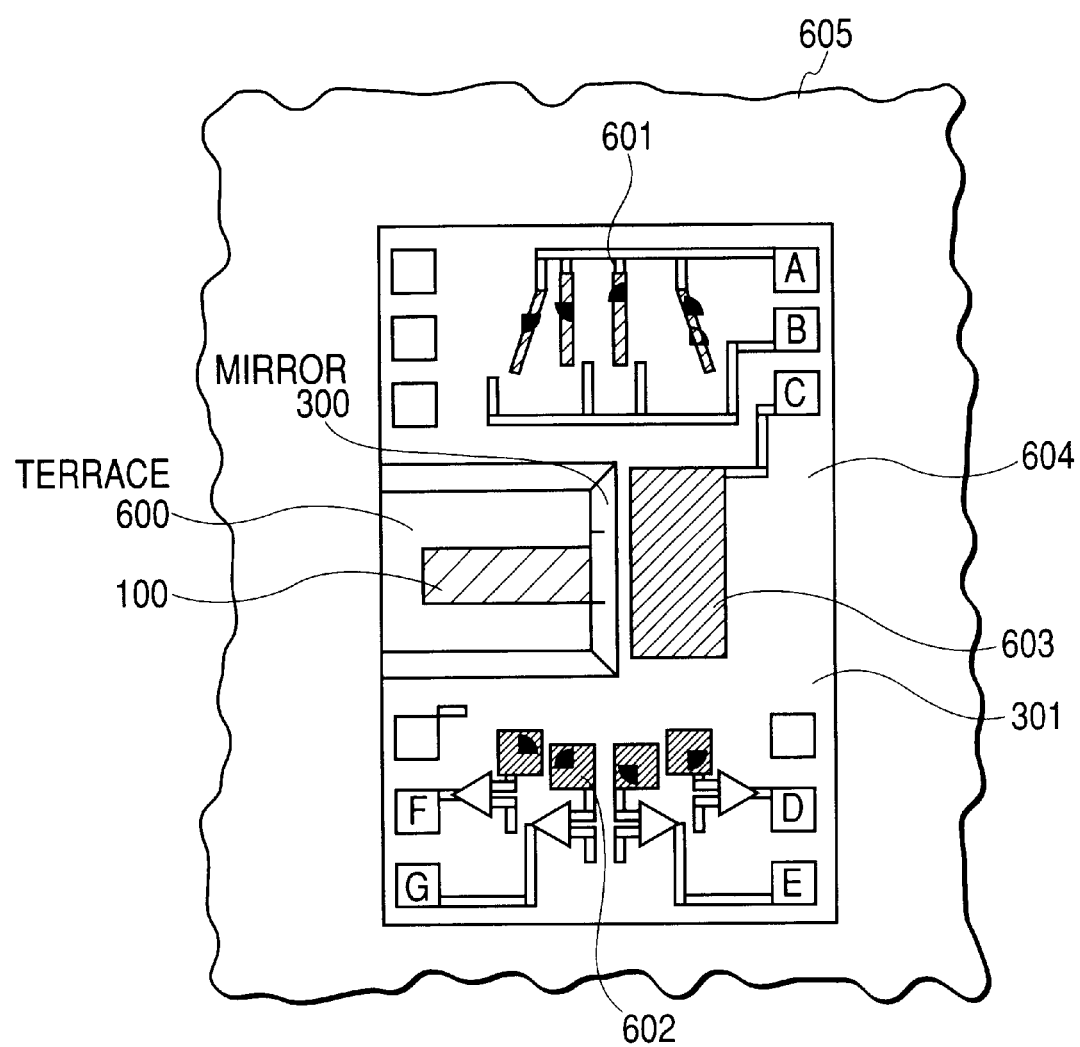
FIG. 6 shows an assembly according to the invention.

FIG. 6 shows a third embodiment of the invention. Formed on the silicone substrate 301 are a terrace 600 and a mirror 300. The diode laser 100 is mounted on the terrace. On the substrate 301 is formed a focus deviation photo-detector array 601 for automatic focusing which is essential for reading and writing an optical disc. Also formed on the substrate is a photo-detector 602 required for detecting a tracking error on the optical disc. An photo-detector 603 monitors an output of the diode laser. An assembly 604 of these optical elements is sealed with a transparent resin 605 and accommodated in a package 303 shown in FIG. 3.

(Embodiment 4)

Figure 7:
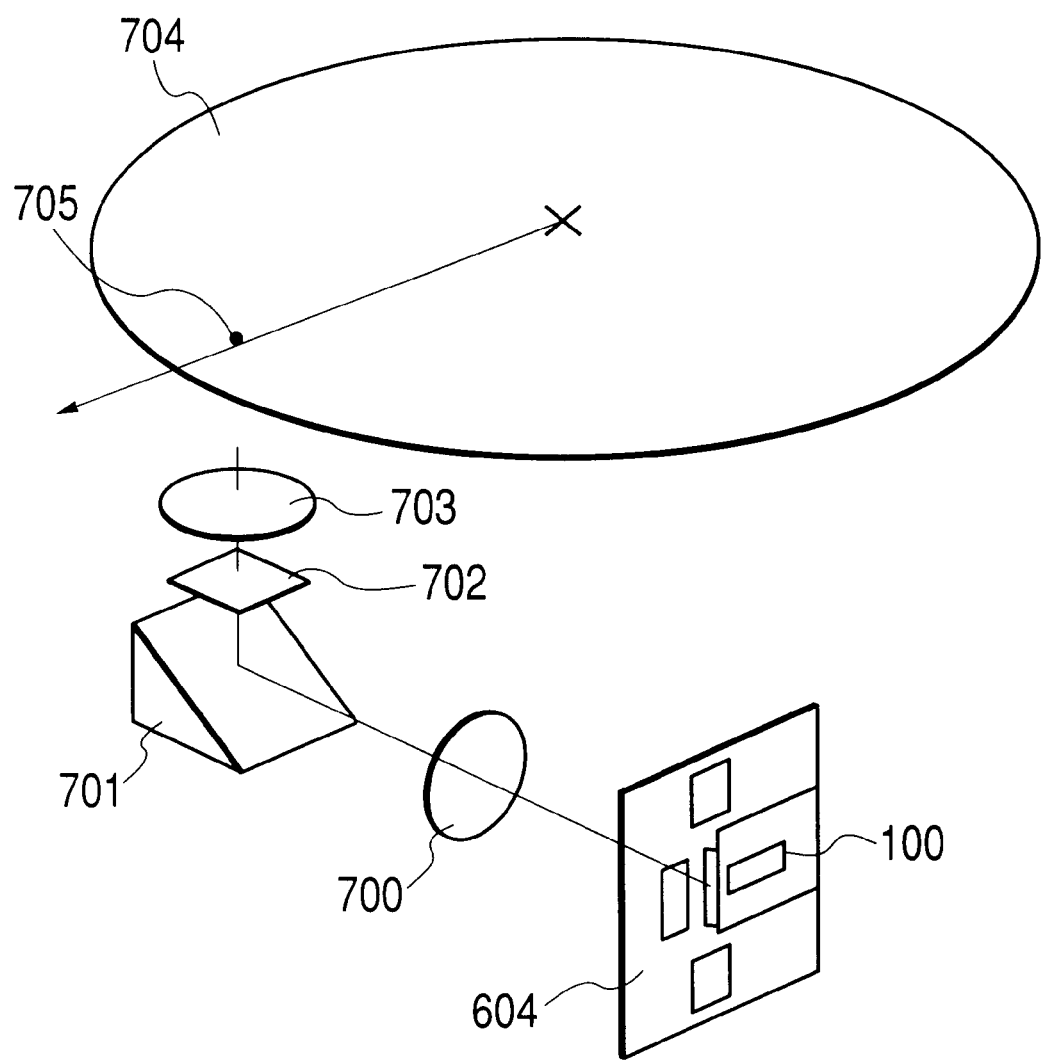
FIG. 7 illustrates a relation between an optical head and an optical disc according to the invention.

FIG. 7 shows a fourth embodiment of the invention. A laser output from the assembly 604 of FIG. 6 is collimated by a light collector lens 700, reflected by a riser mirror 701, passed through a diffraction grating 702, and is focused by an objective lens 703 into a spot 705 on an optical disc 704. Light reflected from the optical disc 704 passes through the objective lens 703 and reaches a beam splitter 702 consisting of the diffraction grating, which branches the reflected light into a signal beam modulated by a pit train on the optical disc, an automatic focus detection beam, and a tracking signal beam, all of which are then fed to the respective photo-detectors on the assembly 604.

(Embodiment 5)

Figure 8:
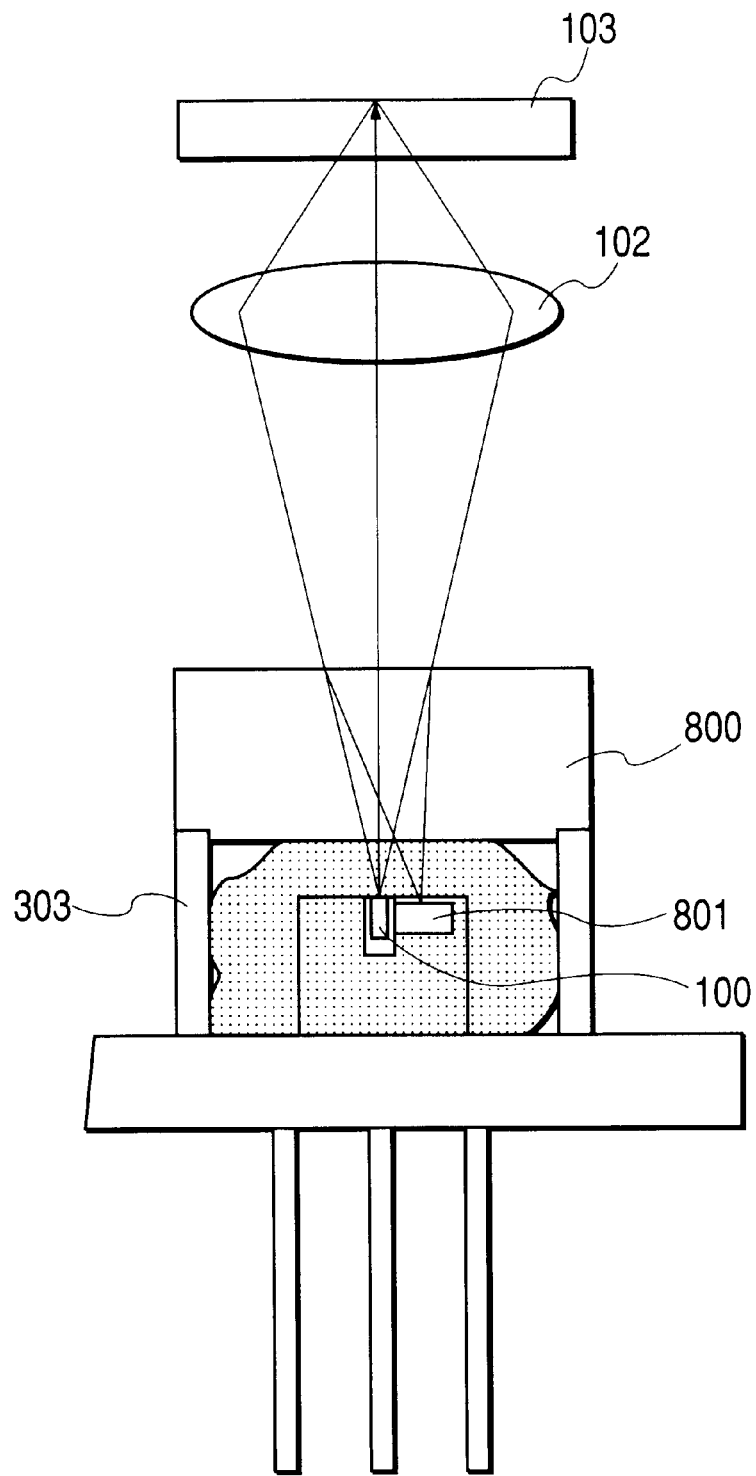
FIG. 8 is a schematic diagram showing an optical head of the invention.

FIG. 8 shows a fifth embodiment of the invention, in which a beam splitter 800 consisting of a diffraction grating doubles as a window of a package 303. Here, the beam splitter 800 is used as the parallel-plane plate of the embodiment 1. A beam from a light source 100 is split by the beam splitter 800 that also serves as a parallel-plane plate used in filling a resin. The beam is then detected by a photo-detector 801. While in this embodiment the beam splitter 800 is used also as a parallel-plane plate, it may be used as a dedicated beam splitter. The beam splitter 800 is also called a hologram element.

(Embodiment 6)

Figure 9:
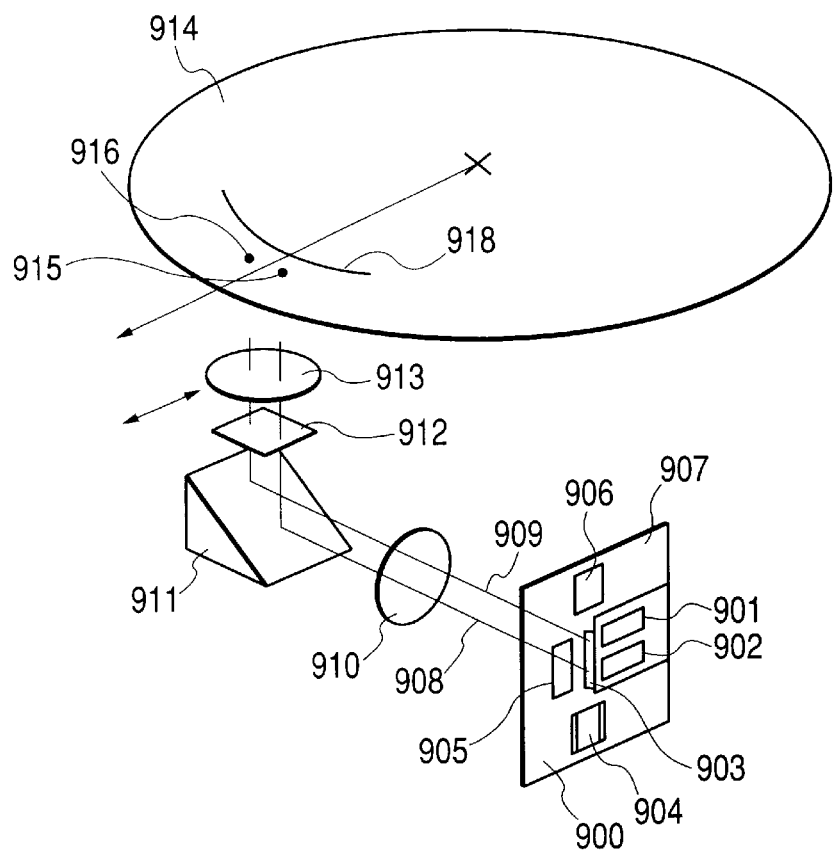
FIG. 9 illustrates a relation between an optical head and an optical disc.

FIG. 9 shows a sixth embodiment of the invention. Laser beams 908, 909 from a module 907, which integrates a semiconductor substrate 900, a plurality of diode laser chips 901, 902, a reflection mirror 903 and photo-detectors 904, 905, 906, are made parallel beams by a collimator lens 910. The parallel beams are reflected by a riser mirror 911 and passes through a diffraction grating 912 to reach an objective lens 913 which focuses the beams into spots 915, 916 on a surface of the optical disc 914. Depending on wavelengths of the diode laser, the objective lens 913 may be provided as a plurality of lenses or as a single lens that can collect light of two or more wavelengths. The lens is driven by an actuator according to the rotating motion of the optical disc to focus the light on the read/write surface of the optical disc and track or follow a recording track 918 on the disc. Thus, according to an on/off operation of the diode lasers, a signal is recorded as a series of pits on the optical disc or is retrieved by reading the recorded pits. With a plurality of diode lasers integrated into the module 907 as described above, the collimator lens 910, the objective lens 913 and the riser mirror 911 can be shared by the lasers, allowing the optical paths of the optical head to be combined into a single path. That is, with this optical head, it is possible to read/write a DVD and a DVD-RAM 0.6 mm thick by a diode laser 901 with a wavelength of 650 nm and also read/write an ultra-high density optical disc by a diode laser 902 with a wavelength of around 400 nm.

Figure 10:
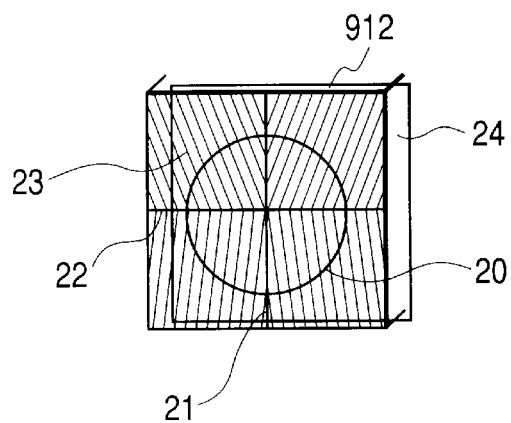
FIG. 10 shows a beam splitter.

FIG. 10 shows a diffraction grating 912. The diffraction grating 912 is a composite element having a four-divided polarity diffraction grating 23 and a one-fourth wavelength plate 24 bonded together, with the four-divided polarity diffraction grating directed toward the diode laser chip side. The four-divided polarity diffraction grating is formed from an optical crystal plate or a liquid crystal plate with double refraction. When the incident light is ordinary light, the four-divided polarity diffraction grating does not refract the light but transmits it. For extraordinary light, it acts as a diffraction grating. In FIG. 9, when the linearly polarized beams 908, 908 emitted from the diode lasers 901, 902 enter the composite element of the four-divided polarity diffraction grating and the one-fourth wavelength plate, in case they enter as ordinary light, they are not diffracted by the four-divided polarity diffraction grating but pass through it and are circularly polarized by the one-fourth wavelength plate of the composite element 912. The laser beams 908 and 909 reflected by the optical disc are turned into extraordinary beams by the one-fourth wavelength plate of the composite element 912 and then diffracted by the four-divided polarity diffraction grating. The composite element shown in FIG. 10 is divided into four areas by boundary lines 21 and 22. A circle 20 denotes a laser beam 908 or 909 which is separated by the four-divided polarity diffraction grating into four positive first-order diffracted beams and four negative first-order diffracted beams which then enter the photo-detectors on the semiconductor substrate where they are subjected to opto-electronic conversion to produce an automatic focus signal, a tracking signal and an information signal. These are detailed in the following.

Figure 11:
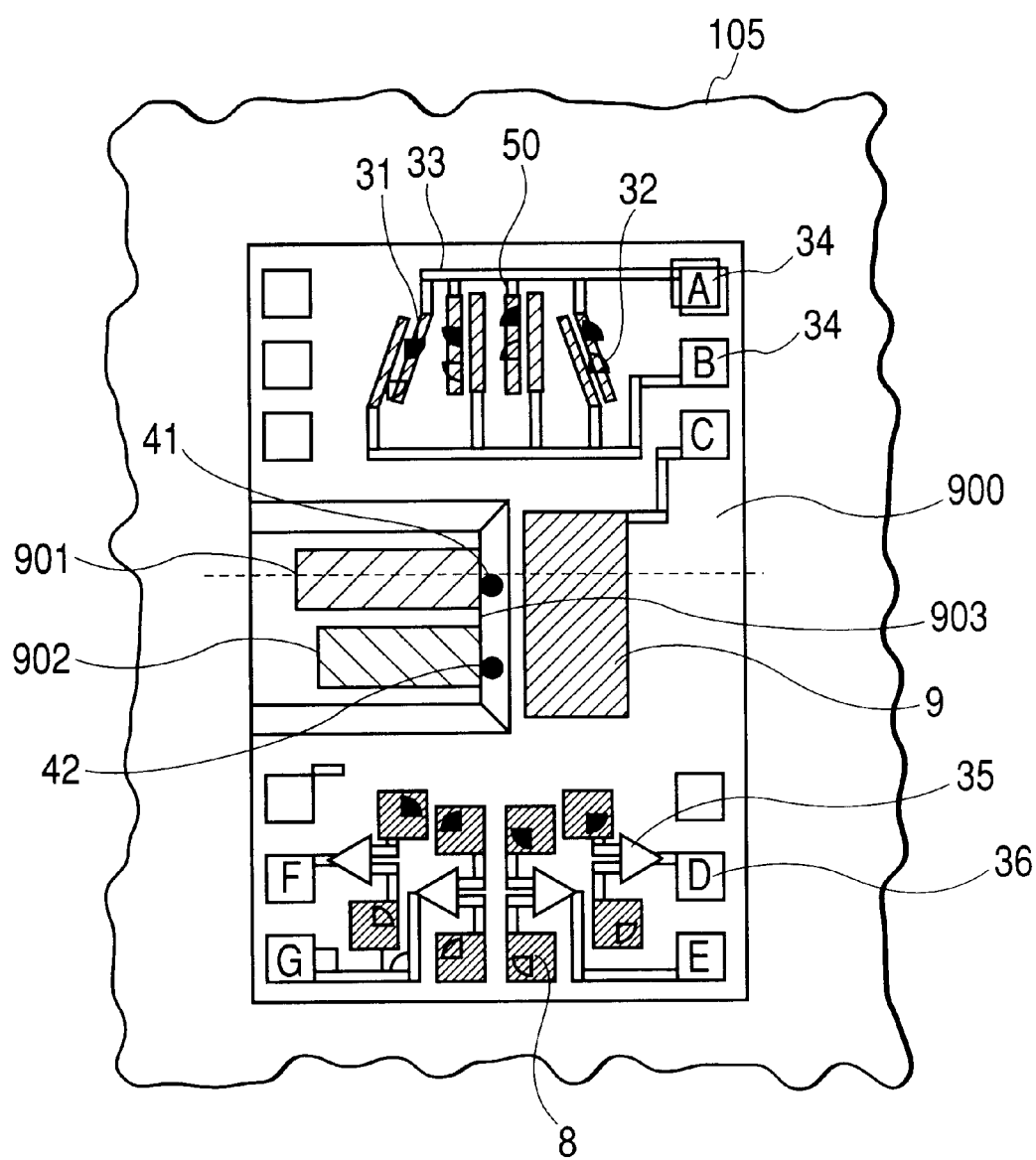
FIG. 11 shows an assembly according to the invention.

FIG. 11 shows a surface of a semiconductor substrate 900 as seen from the collimator lens 910 side of FIG. 9. Eight shaded quarter circles denoted 31 represent a laser beam of a wavelength $\lambda a$ separated by the diffraction grating 23. Eight blank quarter circles denoted 32 represent a laser beam of a wavelength $\lambda b$ separated by the diffraction grating. Designated 50 is a photo-detector that produces a focus deviation detection signal and which comprises eight rectangular photo-detector elements for receiving a laser beam of a wavelength $\lambda a$ and eight rectangular photo-detector elements for receiving a laser beam of a wavelength $\lambda b$. The focus deviation detection method uses a knife edge method (Foucault method) and makes connections using a conductive thin film 33 such as aluminum, as shown in FIG. 11, to obtain differential signals from A-terminal and B-terminal of wire bonding pads 34. Denoted 8 are photo-detector elements to produce a track deviation detection signal and an information retrieval signal. Output signals from the four photo-detector elements pass through an amplifier 35 formed on the semiconductor substrate and are outputted from D, E, F and G-terminals of the pads 36. Designated 9 is a photo-detector element to monitor the quantities of light emitted from the diode laser chips 901 and 902. An output signal of the photo-detector element 9 is produced at C-terminal of the pad 34. Points 41 and 42 indicate the positions on the surface of the reflection mirror 903 where the laser beams emitted from the diode laser chips 901 and 902 are reflected. When, for example, the diffraction grating pitches P of the four areas shown in FIG. 10 are all equal and the directions of diffraction gratings are +α, −α, +3α and −3α degrees with respect to a vertical line 21, and when the focal length of the collimator lens is fc, then the laser beam of a wavelength $\lambda a$ separated by the diffraction grating is focused at those positions on a circle centered at point 41 with a radius Ra=fc×λa/P which are arranged at 2α-degree intervals around the center. Similarly, the laser beam of a wavelength $\lambda b$ separated by the diffraction grating is focused at those positions on a circle centered at point 42 with a radius Rb=fc×λb/P which are arranged at 2α-degree intervals around the center. When an illuminating point interval D between the diode laser chips 901 and 902, which is equal to the distance between point 41 and point 42, is set to D≈fc×(λb−λa)/P, the focusing positions of the laser beam of a wavelength $\lambda a$ and the focusing positions of the laser beam of a wavelength $\lambda b$ can be made to almost match each other, thus allowing the photo-detector element and amplifier to be commonly used by beams of different wavelengths. Not only can this save a surface area of the semiconductor substrate 900, but it can also reduce the number of output lines and wire bonding pads, leading to a reduction in the size of the package that accommodates the semiconductor substrate 900. The subassembly thus constructed is potted with a transparent resin 105 and built into the package 303 shown in FIG. 3. Here while two examples of integrated diode lasers have been shown, this arrangement is also applicable to the integration of three diode lasers, an infrared diode laser, a red diode laser and a blue diode laser.

(Embodiment 7)

Figure 12:
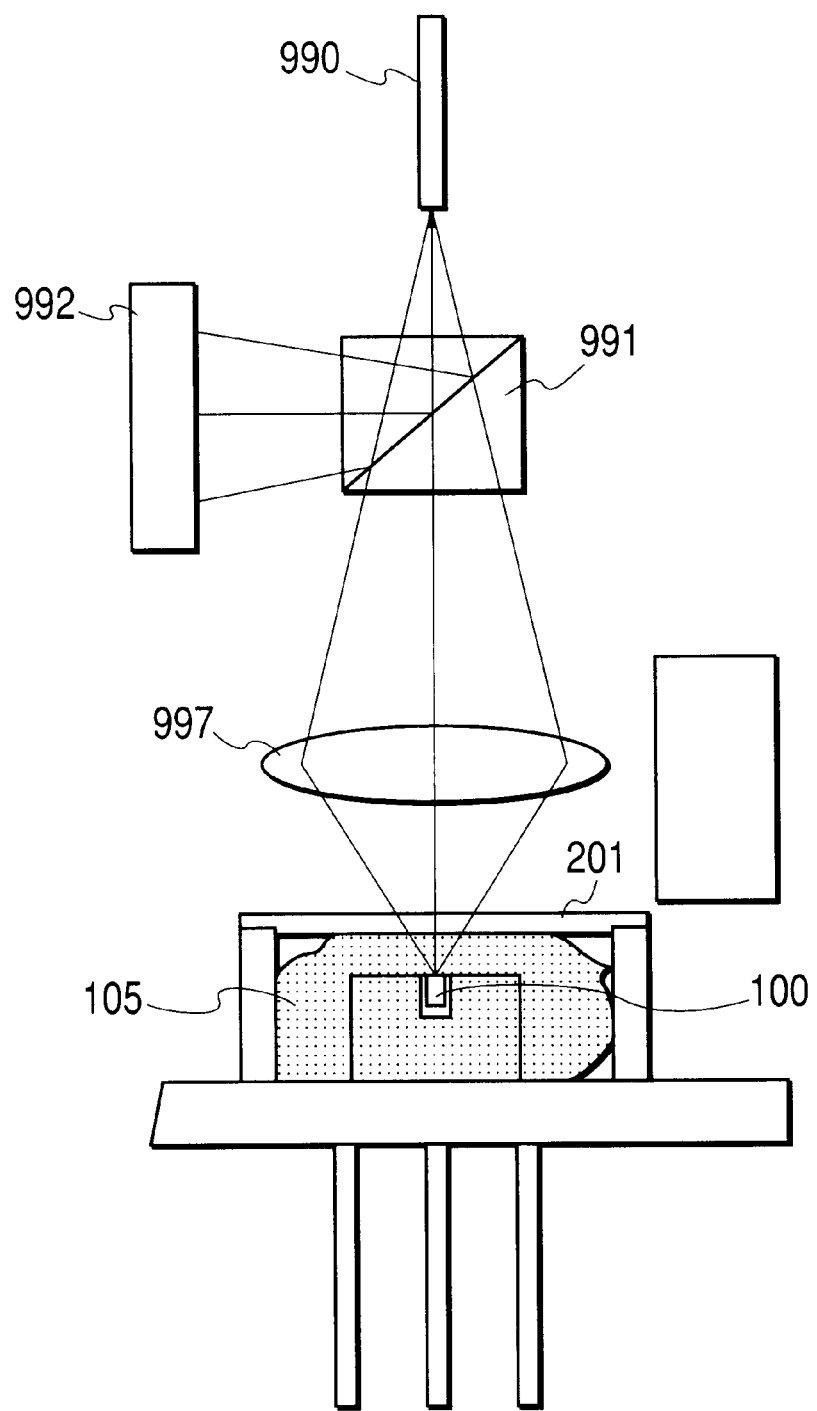
FIG. 12 illustrates an example application of this invention to optical communication.

FIG. 12 shows a seventh embodiment of the invention. A parallel-plane plate 201 is arranged between a diode laser 100, that oscillates at a wavelength of 850 nm, 980 nm, 1300 nm, 1480 nm and 1550 nm, and an objective lens 997. A space between the diode laser 100 and the parallel-plane plate 201 is filled with a transparent resin 105. A spot formed by the objective lens is optically coupled to an optical fiber 990. Light coming from the fiber is reflected by a beam splitter 991 to a photo-detector 992, thus permitting bi-directional communications. It is of course possible to perform one-way transmission without using a beam splitter.

Taking advantage of the transparent resin filling according to the present invention, it is possible to enhance reliability of a single or a plurality of diode lasers, including blue diode lasers, and reduce wavefront aberrations caused by the transparent resin. This in turn allows a series of fine pits on an optical disc to be read out without signal degradations. An optical disc can also be recorded with fine pits without signal degradations.

It should be further understood by those skilled in the art that the foregoing description has been made on embodiments of the invention and that various changes and modifications may be made in the invention without departing from the spirit of the invention and the scope of the appended claims.

What is claimed is:

1. A diode laser module application apparatus comprising:
   a diode laser;
   a lens to focus a beam from the diode laser;
   a plate member arranged between the diode laser and the lens to transmit the beam; and
   a filling material provided between the diode laser and the plate member and provided to transmit the beam and fill an optical path of the beam between the diode laser and the plate member, and
   wherein a standard deviation of a wavefront aberration caused by the filling material and the plate member is 0.07 wavelength or less.

2. A diode laser module application apparatus according to claim 1, wherein an air vent portion is provided to allow the filling material to communicate with open air.

3. A diode laser module application apparatus according to claim 1, wherein a package containing the filling material is provided and formed with an air vent portion for communicating with an outside.

4. A diode laser module application apparatus according to claim 1, wherein the filling material is a silicone resin.

5. A diode laser module application apparatus according to claim 1, wherein the diode laser is arranged in a predetermined area on a substrate and the substrate is formed with a reflection mirror to reflect a beam emitted from the diode laser.

6. A diode laser module application apparatus according to claim 5, wherein a groove is provided between the diode laser and the reflection mirror.

7. A diode laser module application apparatus according to claim 5, wherein a refractive index of the filling material is larger than unity.

8. A diode laser module application apparatus according to claim 4, wherein at least a focus error detection photo-detector, a tracking error detection photo-detector or an information signal retrieval photo-detector is formed on the substrate.

9. An optical disc drive comprising:
   a diode laser to radiate a beam onto an information recording medium;
   a lens to focus the beam from the diode laser;
   a plate member arranged between the diode laser and the lens to transmit the beam;
   a filling material provided between the diode laser and the plate member and provided to transmit the beam and fill an optical path of the beam between the diode laser and the plate member; and
   an optical system having at least a focus error detection photo-detector, a tracking error detection photo-detector or an information signal retrieval photo-detector is formed on a substrate on which the diode laser is mounted,
   wherein a standard deviation of a wavefront aberration caused by the filling material and the plate member is 0.07 wavelength or less.

10. An optical disc drive according to claim 9, wherein a plurality of diode lasers with different wavelengths are mounted.

11. An optical communication device comprising:
    a diode laser;
    a lens to focus a beam from the diode laser;
    a plate member arranged between the diode laser and the lens to transmit the beam;
    a filling material provided between the diode laser and the plate member provided to transmit the beam and fill an optical path of the beam between the diode laser and the plate member; and
    means for guiding an optical spot focused by the lens to an optical fiber or a light guide,
    wherein a standard deviation of a wavefront aberration caused by the filling material and the plate member is 0.07 wavelength or less.

* * * * *